United States Patent
Park et al.

(10) Patent No.: US 11,944,014 B2
(45) Date of Patent: Mar. 26, 2024

(54) MAGNETIC MEMORY DEVICES

(71) Applicant: Samsung Electronics Co., Ltd., Suwon-si (KR)

(72) Inventors: Sanghwan Park, Suwon-si (KR); Jaehoon Kim, Seoul (KR); Yongsung Park, Suwon-si (KR); Hyeonwoo Seo, Suwon-si (KR); Sechung Oh, Yongin-si (KR); Hyun Cho, Changwon-si (KR)

(73) Assignee: Samsung Electronics Co., Ltd. (KR)

( * ) Notice: Subject to any disclaimer, the term of this patent is extended or adjusted under 35 U.S.C. 154(b) by 337 days.

(21) Appl. No.: 17/358,435

(22) Filed: Jun. 25, 2021

(65) Prior Publication Data

US 2022/0158085 A1 May 19, 2022

(30) Foreign Application Priority Data

Nov. 16, 2020 (KR) .................. 10-2020-0153076

(51) Int. Cl.
*H10N 50/10* (2023.01)
*G11C 11/16* (2006.01)
*H10B 61/00* (2023.01)
*H10N 50/80* (2023.01)
*H10N 50/85* (2023.01)

(52) U.S. Cl.
CPC .......... *H10N 50/10* (2023.02); *G11C 11/161* (2013.01); *H10B 61/22* (2023.02); *H10N 50/80* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 8,421,171 B2 * | 4/2013 | Yen | G11C 11/161 257/E29.323 |
| 8,755,222 B2 | 6/2014 | Kent et al. | |
| 9,070,855 B2 * | 6/2015 | Gan | H01F 10/3286 |
| 9,184,376 B2 * | 11/2015 | Park | H10N 50/10 |
| 9,647,032 B2 * | 5/2017 | Wang | H10B 61/22 |
| 9,825,216 B2 * | 11/2017 | Park | H10N 50/85 |
| 10,026,892 B2 | 7/2018 | Pinarbasi et al. | |
| 10,360,961 B1 | 7/2019 | Tzoufras et al. | |
| 10,753,989 B2 * | 8/2020 | Campiglio | G01R 33/093 |
| 11,476,412 B2 * | 10/2022 | Gosavi | G11C 11/161 |
| 2014/0175574 A1 * | 6/2014 | Watts | H01L 29/66007 257/421 |
| 2018/0219152 A1 * | 8/2018 | Apalkov | H01F 10/329 |
| 2020/0052191 A1 * | 2/2020 | Ma | H01F 10/3286 |

FOREIGN PATENT DOCUMENTS

KR 20180007172 A 1/2018

* cited by examiner

*Primary Examiner* — Kevin M Bernatz
(74) *Attorney, Agent, or Firm* — Myers Bigel, P.A.

(57) ABSTRACT

A magnetic memory device including a magnetic tunnel junction is provided. The magnetic tunnel junction includes a fixed layer, a polarization enhancement structure on the fixed layer, a tunnel barrier layer on the polarization enhancement structure, and a free layer on the tunnel barrier layer, wherein the polarization enhancement structure includes a plurality of polarization enhancement layers and at least one spacer layer which separates the plurality of polarization enhancement layers from each other. A thickness of each of the plurality of polarization enhancement layers is from 5 Å to about 20 Å, and a thickness of the at least one spacer layer is from about 2 Å to about 15 Å.

20 Claims, 7 Drawing Sheets

MAGNETIC MEMORY DEVICES

CROSS-REFERENCE TO RELATED APPLICATION

This application is based on and claims priority under 35 U.S.C. § 119 to Korean Patent Application No. 10-2020-0153076, filed on Nov. 16, 2020, in the Korean Intellectual Property Office, the disclosure of which is incorporated by reference herein in its entirety.

BACKGROUND

The present disclosure relates to magnetic memory devices. More particularly, the present disclosure relates to magnetic memory devices that include magnetic tunnel junctions.

Due to the increasing desire for electronic devices with high speeds and low power consumption, there have been corresponding increasing demands for memory devices with high speeds and low power consumptions for inclusion in such electronic devices. Magnetic memory devices have been suggested as one potential type of memory device that may fulfill such demands. A magnetic memory device may include a magnetic tunnel junction.

SUMMARY

The present disclosure provides magnetic memory devices with improved cell retention in a parallel to anti-parallel direction, improved asymmetry between a switching current in the parallel to anti-parallel direction and a switching current in an anti-parallel to parallel direction, and improved heat resistance, although the present disclosure is not limited to these improvements and enhancements.

According to some aspects of the inventive concepts, a magnetic memory device is provided, with the magnetic memory device including a magnetic tunnel junction. The magnetic tunnel junction may include: a fixed layer, a polarization enhancement structure on the fixed layer, a tunnel barrier layer on the polarization enhancement structure, and a free layer on the tunnel barrier layer. The polarization enhancement structure may include a plurality of polarization enhancement layers and at least one spacer layer which may separate the plurality of polarization enhancement layers from each other. A thickness of each of the plurality of polarization enhancement layers may be from about 5 Å to about 20 Å, and a thickness of the at least one spacer layer may be from about 2 Å to about 15 Å.

According to some aspects of the inventive concepts, a magnetic memory device including a magnetic tunnel junction is provided. The magnetic tunnel junction may include a fixed layer, a polarization enhancement structure on the fixed layer, a tunnel barrier on the polarization enhancement structure, and a free layer on the tunnel barrier layer. The polarization enhancement structure may include a plurality of cobalt-iron-boron (CoFeB) layers and at least one molybdenum-cobalt-iron (MoCoFe) layer which may separate the plurality of CoFeB layers from one another.

According to some aspects of the inventive concepts, a magnetic memory device including a magnetic tunnel junction is provided. The magnetic tunnel junction may include: a fixed layer, a polarization enhancement structure on the fixed layer, a tunnel barrier layer on the polarization enhancement structure, and a free layer on the tunnel barrier layer. The polarization enhancement structure may include a plurality of polarization enhancement layers and a plurality of spacer layers that may be alternately stacked. A thickness of a first polarization enhancement layer of the plurality of polarization enhancement layers may differ from a thickness of a second polarization enhancement layer of the plurality of polarization enhancement layers.

BRIEF DESCRIPTION OF THE DRAWINGS

Aspects of the present disclosure, and some examples of embodiments of the inventive concepts thereof, will be more clearly understood from the following detailed description taken in conjunction with the accompanying drawings in which.

DETAILED DESCRIPTION OF THE EMBODIMENTS

Figure 1:
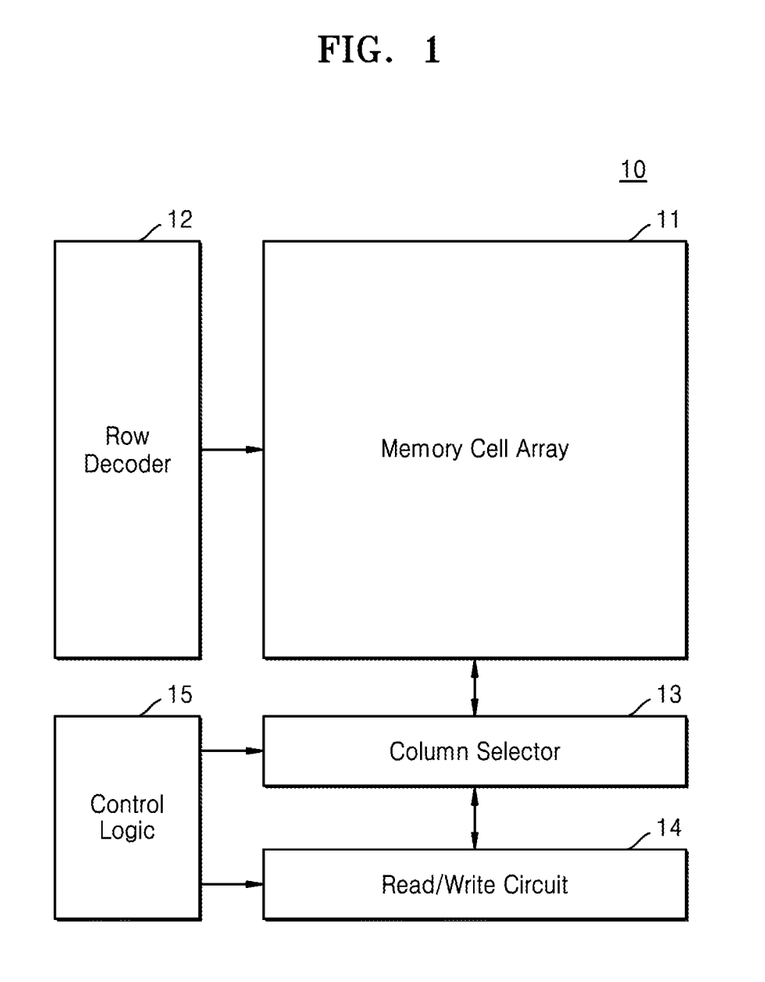
FIG. 1 is a block diagram of a magnetic memory device according to some embodiments of the inventive concepts.

FIG. 1 is a block diagram of a magnetic memory device 10 according to some embodiments of the inventive concepts.

Referring to FIG. 1, the magnetic memory device 10 may include a memory cell array 11, a row decoder 12, a column selector 13, a read/write circuit 14, and a control logic 15.

Figure 2:
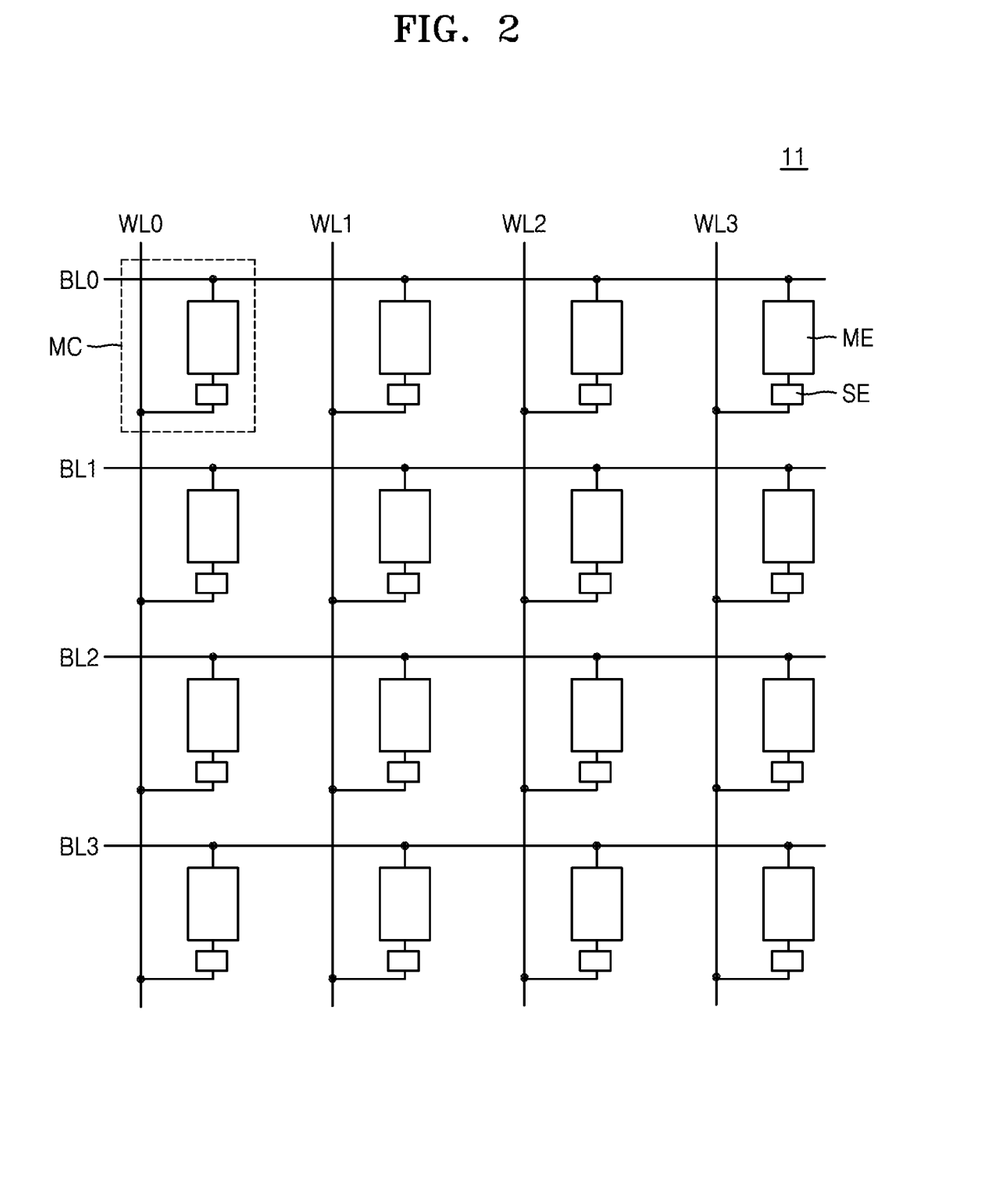
FIG. 2 is a circuit diagram of a memory cell array included in a magnetic memory device according to some embodiments of the inventive concepts.
Figure 3:
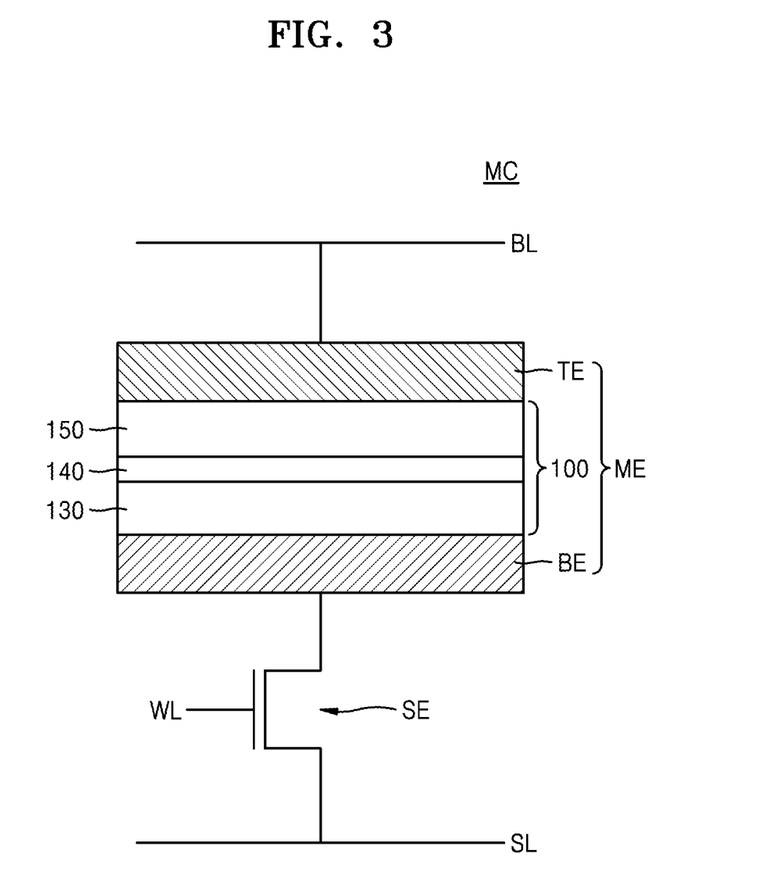
FIG. 3 is a schematic diagram of a memory cell included in a magnetic memory device according to some embodiments of the inventive concepts.

The memory cell array 11 may include a plurality of memory cells MCs (see FIGS. 2 and 3). The memory cell array 11 will be described in greater detail below with reference to FIG. 2.

The row decoder 12 may be connected to the memory cell array 11 through a plurality of word lines WL0 through WL3 (see FIG. 2). The row decoder 12 may select at least one of the plurality of word lines WL0 through WL3 (see FIG. 2) by decoding an address input from an external source (not shown).

The column selector 13 may be connected to the memory cell array 11 through a plurality of bit lines BL0 through BL3 (see FIG. 2). The column selector 13 may select at least one of the plurality of bit lines BL0 through BL3 (see FIG. 2) by decoding the address input from the external source. The at least one bit line selected by the column selector 13 may be connected to the read/write circuit 14.

The read/write circuit 14 may provide a bit line voltage to the at least one bit line selected by the column selector 13 to write input data to the memory cell array 11 or read data stored in the memory cell array 11.

The control logic 15 may generate control signals to control the magnetic memory device 10 according to a command signal provided from the external source. The read/write circuit 14 may be controlled by the control signals. In some embodiments, the row decoder 12 and the column selector 13 may also be controlled by the control signals.

FIG. 2 is a circuit diagram of the memory cell array 11 included in the magnetic memory device 10 (see FIG. 1) according to some embodiments of the inventive concepts.

Referring to FIG. 2, the memory cell array 11 may include the plurality of memory cells MCs. The plurality of memory cells MCs may be connected to the plurality of word lines WL0 through WL3 and the plurality of bit lines BL0 through BL3. Each of the plurality of memory cells MCs may be connected between one of the plurality of word lines WL0 through WL3 and one of the plurality of bit lines BL0 through BL3. Stated differently, each of the plurality of memory cells MCs may be respectively connected to one of the plurality of bit lines BL0 through BL3, and respectively connected to one of the plurality of word lines WL0 through WL3. Accordingly, a memory cell MC may be selected by selecting one of the plurality of word lines WL0 through WL3 and one of the plurality of bit lines BL0 through BL3.

Each of the plurality of memory cells MCs may include a memory unit ME and a switching unit SE. The memory unit ME of each of the plurality of memory cells MCs may include a variable resistor unit that may be switched into one of two types of resistance states in response to electrical signals applied to the memory unit ME. The switching unit SE of each of the plurality of memory cells MCs may be configured to selectively control flow of a current flowing through the memory unit ME of the memory cell MC. For example, the switching unit SE may include a field effect transistor, a diode transistor, or a bipolar transistor. The memory cell MC will be described in further detail below with reference to FIG. 3.

FIG. 3 is a schematic diagram of the memory cell MC included in the magnetic memory device 10 (see FIG. 1) according to some embodiments of the inventive concepts.

Referring to FIG. 3, the memory cell MC may include the memory unit ME and the switching unit SE. The memory unit ME may include a magnetic tunnel junction 100. In some embodiments, the memory unit ME may further include a bottom electrode BE under the magnetic tunnel junction 100 and a top electrode TE on the magnetic tunnel junction 100. That is, the magnetic tunnel junction 100 may be between the bottom electrode BE and the top electrode TE. Although reference is made to a top electrode TE and bottom electrode BE, it is to be understood that these references are for convenience of explanation and that the present disclosure is not limited to any particular orientation.

Figure 5:
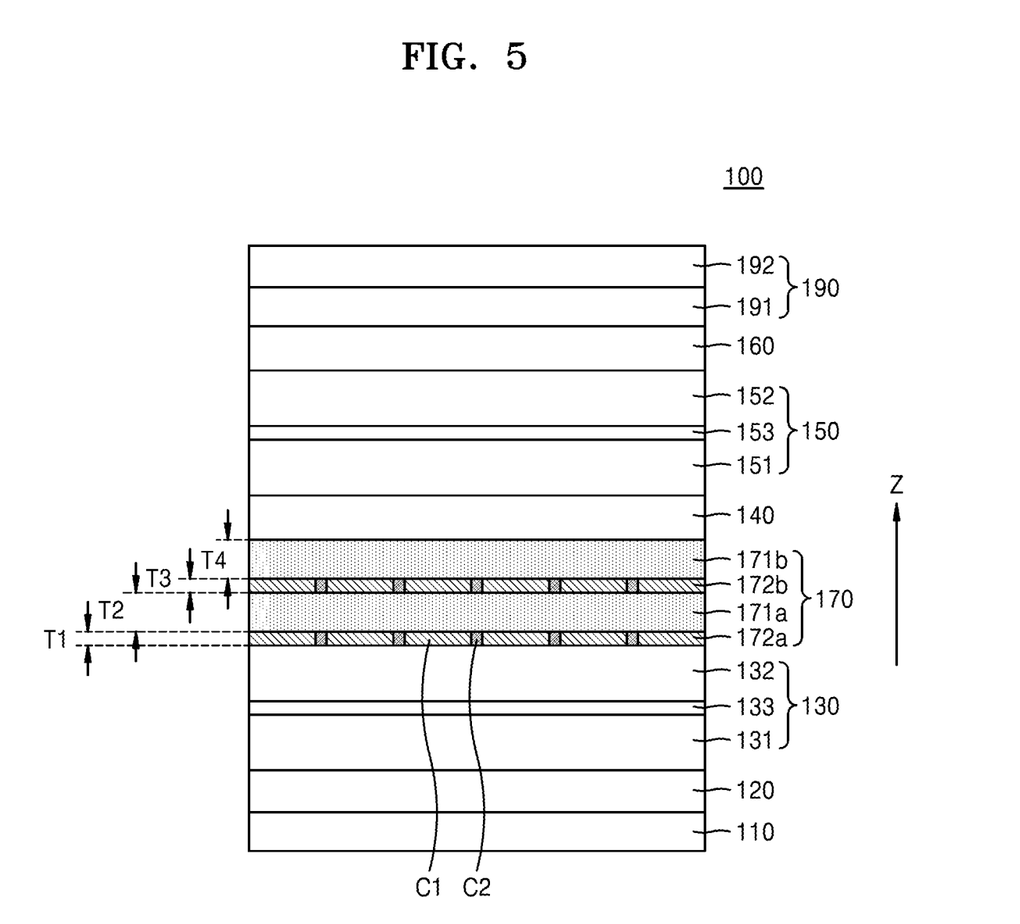
FIG. 5 is a cross-sectional view of a magnetic tunnel junction included in a magnetic memory device according to some embodiments of the inventive concepts.
Figure 6:
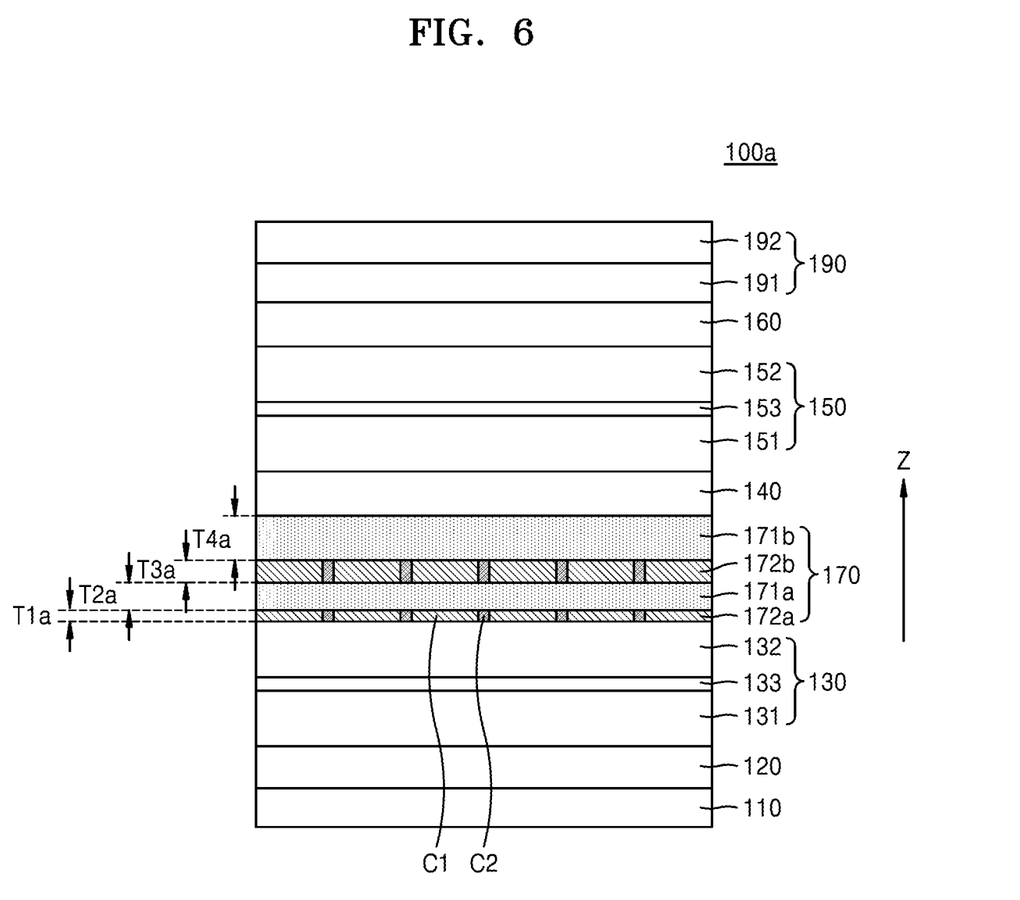
FIG. 6 is a cross-sectional view of a magnetic tunnel junction included in a magnetic memory device according to some embodiments of the inventive concepts.

The magnetic tunnel junction 100 may include a fixed layer 130, a free layer 150, and a tunnel barrier layer 140 between the fixed layer 130 and the free layer 150. As shown in FIGS. 5 and 6, the magnetic tunnel junction 100 may include more layers, and the fixed layer 130 and the free layer 150 may each include a plurality of layers. However, for convenience of explanation, the magnetic tunnel junction 100 is only schematically shown in FIG. 3. Details of a configuration of the magnetic tunnel junction 100 will be described later with reference to FIGS. 5 and 6.

The fixed layer 130 may have a fixed magnetization direction, while the free layer 150 may have a variable magnetization direction. When magnetization directions of the fixed layer 130 and the free layer 150 are oriented in parallel to each other, the possibility that electrons are tunneled through the tunnel barrier layer 140 increases, and therefore, the magnetic tunnel junction 100 is in a low resistance state. On the contrary, when the magnetization directions of the fixed layer 130 and the free layer 150 are oriented opposite (that is, antiparallel) to each other, the possibility that the electrons are tunneled through the tunnel barrier layer 140 decreases, and therefore, the magnetic tunnel junction 100 is in a high resistance state. Consequently, the magnetic tunnel junction 100 may be switched between two electric resistance states, that is, the low resistance state and the high resistance state. Due to such a characteristic, the magnetic tunnel junction 100 may be used to store data.

In some embodiments, the switching unit SE may include a field effect transistor. In some embodiments, a source line SL may be connected to a first source/drain of the switching unit SE, and the magnetic tunnel junction 100 may be connected to a second source/drain of the switching unit SE through the bottom electrode BE. In addition, a word line WL may be connected to a gate of the switching unit SE. The magnetic tunnel junction 100 may be connected to the source line SL through the bottom electrode BE and the switching unit SE, and may be connected to a bit line BL through the top electrode TE. In some embodiments, the bit line BL and the source line SL may be exchanged with each other. That is, the magnetic tunnel junction 100 may be connected to the bit line BL through the bottom electrode BE and the switching unit SE, and may be connected to the source line BL through the top electrode TE. Stated differently, either the free layer 150 or the fixed layer 130 of the magnetic tunnel junction 100 may be connected to the bit line BL through the bottom electrode BE and the switching unit SE, and the other of the fixed layer 130 and free layer 150 may be connected to the source line BL through the top electrode TE. By turning on/off the switching unit SE through controlling a voltage of the word line WL, the magnetic tunnel junction 100 may be selectively connected to the source line SL.

For a write operation of a memory device, the switching unit SE may be turned on by applying a voltage to the word line WL, and a write current may be applied between the bit line BL and the source line SL. Here, the magnetization direction of the free layer 150 may be determined according to directions of the write current. For a read operation of the magnetic memory device 10, the switching unit SE may be turned on by applying a voltage to the word line WL, and data stored in the magnetic tunnel junction 100 may be recognized by applying a read current from the bit line BL in a direction of the source line SL. Here, the read current is much smaller than the write current, and therefore, the magnetization direction of the free layer 150 may be not changed by the read current.

Figure 4:
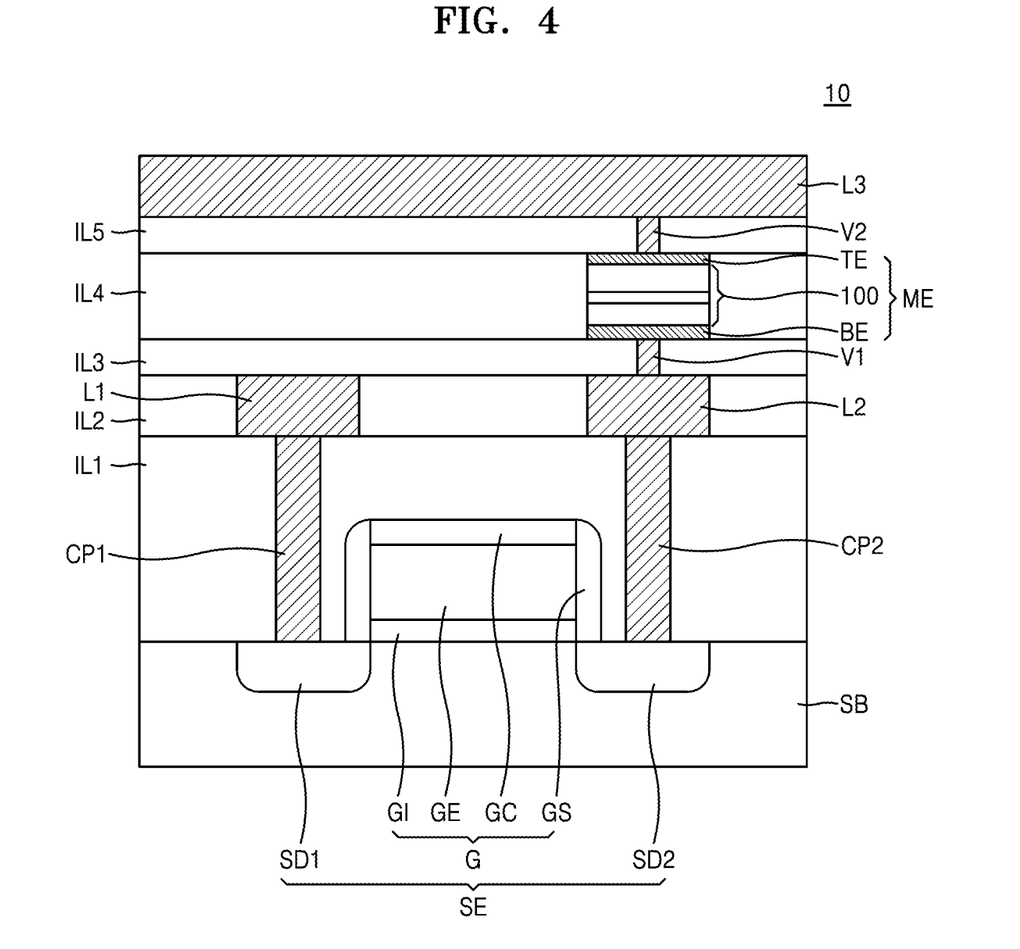
FIG. 4 is a cross-sectional view of a magnetic memory device according to some embodiments of the inventive concepts.

FIG. 4 is a cross-sectional view of the magnetic memory device 10 according to some embodiments of the inventive concepts.

Referring to FIG. 4, the magnetic memory device 10 may include a substrate SB, the switching unit SE on the substrate SB, and the magnetic tunnel junction 100 connected to the switching unit SE.

The substrate SB may include a semiconductor material such as a Group IV semiconductor material, a Group III-V semiconductor material, or a Group II-VI semiconductor material. The Group IV semiconductor material may include, for example silicon (Si), germanium (Ge), or SiGe. The Group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The Group II-VI semiconductor material may include, for example, zinc telluride (ZnTe) or cadmium sulfide (CdS). The substrate SB may include a bulk wafer or an epitaxial layer.

The switching unit SE may include a gate structure G, which may be formed on the substrate SB, and a first source/drain structure SD1 and a second source/drain structure SD2 respectively adjacent to first and second sides of the gate structure G. The gate structure G may include a gate insulating layer GI, a gate electrode layer GE, and a gate capping layer GC stacked on the substrate SB. The gate structure G may further include a gate spacer layer GS on lateral or side surfaces of the gate insulating layer GI, the gate electrode layer GE, and the gate capping layer GC.

In some embodiments, the gate insulating layer GI may include an interface layer on the substrate SB and a high-dielectric layer on the interface layer. The interface layer may include a low-dielectric material having a permittivity of 9 or less, for example, silicon oxide ($SiO_2$), silicon nitride (SiN), or combinations thereof. In some embodiments, the interface layer may be omitted. The high-dielectric layer may include a material having a dielectric constant greater than that of $SiO_2$, for example a material having a dielectric constant from about 10 to about 25. The high-dielectric layer may include, for example, hafnium oxide ($HfO_2$), zirconium dioxide ($ZrO_2$), aluminum oxide ($Al_2O_3$), or combinations thereof.

The gate electrode layer GE may include a metal, a metal nitride, a metal carbide, a semiconductor, or combinations thereof. The metal may include titanium (Ti), tungsten (W), ruthenium (Ru), niobium (Nb), molybdenum (Mo), Hf, nickel (Ni), cobalt (Co), platinum (Pt), ytterbium (Yb), terbium (Tb), dysprosium (Dy), erbium (Er), palladium (Pd), or combinations thereof. The metal nitride may include titanium nitride (TiN), tantalum nitride (TaN), or a combination thereof. The metal carbide may include titanium aluminum carbide (TiAlC). The semiconductor may include polysilicon.

The gate capping layer GC may include, for example, SiN. The gate spacer layer GS may include, for example, $SiO_2$, SiN, or a combination thereof.

The first source/drain structure SD1 and the second source/drain structure SD2 may each include a semiconductor material such as a Group IV semiconductor material, a Group III-V semiconductor material, or a Group II-VI semiconductor material. The Group IV semiconductor material may include, for example Si, Ge, or SiGe. The Group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The Group II-VI semiconductor material may include, for example, zinc telluride (ZnTe) or cadmium sulfide (CdS). For example, the first source/drain structure SD1 and the second source/drain structure SD2 may each include Si. In some embodiments, the first source/drain structure SD1 and the second source/drain structure SD2 may be formed from the substrate SB. In some embodiments, the first source/drain structure SD1 and the second source/drain structure SD2 may each include SiGe layers, respectively having different concentrations, and a Si capping layer.

In some embodiments, the magnetic memory device 10 may further include a first interlayer insulating layer IL1 covering the substrate SB and the switching unit SE. The first interlayer insulating layer IL1 may include, for example, $SiO_2$, SiN, or a combination thereof. The magnetic memory device 10 may further include a first conductive line L1 and a second conductive line L2 on the first interlayer insulating layer IL1. The magnetic memory device 10 may further include a first contact plug CP1 and a second contact plug CP2 that each penetrate the first interlayer insulating layer IL1. The first contact plug CP1 may connect the first conductive line L1 to the first source/drain structure SD1, and the second contact plug CP2 may connect the second conductive line L2 to the second source/drain structure SD2. The first conductive line L1 may correspond to or be connected to the source line SL shown in FIG. 3. The first conductive line L1, the second conductive line L2, the first contact plug CP1, and the second contact plug CP2 may each include a metal and a metal barrier layer. The metal may include W, Ti, Ta, Al, copper (Cu), silver (Ag), gold (Au), or combinations thereof. The metal barrier layer may include Ti, Ta, TiN, TaN, or combinations thereof.

In some embodiments, the magnetic memory device 10 may further include a second interlayer insulating layer IL2 on the first interlayer insulating layer ILL and the second interlayer insulating layer IL may surround a side of the first conductive line L1 and a side of the second conductive line L2. The magnetic memory device 10 may further include a third interlayer insulating layer IL3 on the second interlayer insulating layer IL2. The second interlayer insulating layer IL2 and the third interlayer insulating layer IL3 may each include $SiO_2$, SiN, or a combination thereof.

The memory unit ME may be on the third interlayer insulating layer IL3. The bottom electrode BE and the top electrode TE may each include a metal, a metal nitride, or combinations thereof. For example, the bottom electrode BE and the top electrode TE may each include Ta, Ru, TaN, or combinations thereof. The magnetic tunnel junction 100 will be described in detail later with reference to FIGS. 5 and 6.

In some embodiments, the magnetic memory device 10 may further include a first via V1 that penetrates the third interlayer insulating layer IL3 and connects the bottom electrode BE to the second conductive line L2. The first via V1 may include a metal and a metal barrier layer. The metal may include W, Ti, Ta, Al, Cu, Ag, Au, or combinations thereof. The metal barrier layer may include Ti, Ta, TiN, TaN, or combinations thereof.

In some embodiments, the magnetic memory device 10 may further include a fourth interlayer insulating layer IL4 that is on the third interlayer insulating layer IL3 and surrounds the memory unit ME. In some embodiments, the magnetic memory device 10 may further include a fifth interlayer insulating layer IL5 on the fourth interlayer insulating layer IL4. The fourth interlayer insulating layer IL4 and the fifth interlayer insulating layer IL5 may each include $SiO_2$, SiN, or a combination thereof.

In some embodiments, the magnetic memory device 10 may further include a third conductive line L3 on the fifth interlayer insulating layer IL5. The third conductive line L3 may correspond to or be connected to the bit line BL shown in FIG. 3. In some embodiments, the magnetic memory device 10 may further include a second via V2 which connects the third conductive line L3 to the top electrode TE and penetrates the fifth interlayer insulating layer IL5. The third conductive line L3 and the second via V2 may each include a metal and a metal barrier layer. The metal may include W, Ti, Ta, Al, Cu, Ag, Au, or combinations thereof. The metal barrier layer may include Ti, Ta, TiN, TaN, or combinations thereof.

FIG. 5 is a cross-sectional view of a magnetic tunnel junction 100 included in the magnetic memory device 10 (see FIG. 1) according to some embodiments of the inventive concepts.

Referring to FIG. 5, the magnetic tunnel junction 100 may include the fixed layer 130, a polarization enhancement structure 170, the tunnel barrier layer 140, and the free layer 150 stacked in a vertical direction (the Z direction). That is, the magnetic tunnel junction 100 may include the fixed layer 130, the polarization enhancement structure 170 on the fixed layer 130, the tunnel barrier layer 140 on the polarization enhancement structure 170, and the free layer 150 on the tunnel barrier layer 140.

In some embodiments, the magnetic tunnel junction 100 may further include a seed layer 120 under or below the fixed layer 130. In some embodiments, the magnetic tunnel junction 100 may further include a buffer layer 110 under or below the seed layer 120. In some embodiments, the magnetic tunnel junction 100 may further include a perpendicular magnetic anisotropy enhancement layer 160 on or above the free layer 150. In some embodiments, the magnetic tunnel junction 100 may further include a capping layer 190 on or above the perpendicular magnetic anisotropy enhancement layer 160.

The buffer layer 110 may be configured to at least partially prevent a crystallinity of the bottom electrode BE (see FIGS. 1 and 2) from having influences on a crystallinity of layers on or above the buffer layer 110, for example, the seed layer 120, the fixed layer 130, the polarization enhancement structure 170, the tunnel barrier layer 140, and the free layer 150. In some embodiments, the buffer layer 110 may be amorphous. The buffer layer 110 may be non-magnetic or magnetic. In some embodiments, the buffer layer 110 may include XY, where X may include iron (Fe), Co, or a combination thereof, and Y may include Hf, yttrium (Y), Zr, or combinations thereof.

The seed layer 120 may be configured to help the fixed layer 130, the polarization enhancement structure 170, the tunnel barrier layer 140, and the free layer 150 respectively have desirable crystal structures. In some embodiments, the seed layer 120 may have a hexagonal close-packed (HCP) structure. In some embodiments, the seed layer 120 may be amorphous. The seed layer 120 may be non-magnetic or magnetic. In some embodiments, the seed layer 120 may include nichrome (NiCr), cobalt iron boride (CoFeB), magnesium (Mg), Ta, Ru, or combinations thereof.

The fixed layer 130 may have a fixed magnetization direction. The fixed magnetization direction may be a vertical direction (the Z direction) or a direction opposite to the vertical direction (the −Z direction).

In some embodiment, the fixed layer 130 may include a first fixed layer 131 on the seed layer 120, an anti-parallel coupling layer 133 on the first fixed layer 131, and a second fixed layer 132 on the anti-parallel coupling layer 133. The first fixed layer 131 may also be referred to as a hard bias stack. The second fixed layer 132 may also be referred to as a reference layer. The anti-parallel coupling layer 133 may also be referred to as a synthetic antiferromagnetic (SAF) layer.

Each of the first fixed layer 131 and the second fixed layer 132 may be crystalline. Each of the first fixed layer 131 and the second fixed layer 132 may be ferromagnetic. The first fixed layer 131 and the second fixed layer 132 may respectively have fixed magnetization directions. However, a magnetization direction of the second fixed layer 132 may be opposite to a magnetization direction of the first fixed layer 131. For example, the magnetization direction of the first fixed layer 131 may be the vertical direction (the Z direction), while the magnetization of the second fixed layer 132 is the direction opposite to the vertical direction (the −Z direction). Each of the first fixed layer 131 and the second fixed layer 132 may include at least one of Co, Ni, and Fe. For example, each of the first fixed layer 131 and the second fixed layer 132 may include CoNi, CoFeB, CoCr, CoFe, CoPt, FeB, CoB, CoFeAl, or combinations thereof.

The anti-parallel coupling layer 133 may help the magnetization direction of the first fixed layer 131 and the magnetization direction of the second fixed layer 132 be anti-parallel to each other. The anti-parallel coupling layer 133 may include, for example, Ru, iridium (Ir), rhenium (Re), rhodium (Rh), tellurium (Te), Y, Cr, Ag, Cu, or combinations thereof. For example, the anti-parallel coupling layer 133 may include Ru.

The polarization enhancement structure 170 may include a plurality of polarization enhancement layers. For example, the polarization enhancement structure 170 may include a first polarization enhancement layer 171a and a second polarization enhancement layer 171b. The polarization enhancement structure 170 may also include at least one spacer layer, for example a first spacer layer 172a and a second spacer layer 172b. The first and second spacer layer 172a and 172b may separate the plurality of polarization enhancement layers 171a and 172b from each other. That is, the plurality of polarization enhancement layers 171a and 171b and the at least one spacer layer 172a and 172b may be alternately stacked on the fixed layer 130.

When the polarization enhancement structure 170 includes only one polarization enhancement layer, polarization enhancement performance may be improved as a thickness of the polarization enhancement layer increases, but the perpendicular magnetic anisotropy thereof decreases. According to the inventive concept, by increasing the number of polarization enhancement layers, the polarization enhancement performance may be improved, and thicknesses T2 and T4 of the polarization enhancement layers 171a and 171b may be not increased. Accordingly, decrease in perpendicular magnetic anisotropy may be prevented. Accordingly, as the decrease in perpendicular magnetic anisotropy may be prevented even at a high temperature, the heat resistance of the magnetic memory device including the magnetic tunnel junction 100 may be improved. By using the polarization enhancement structure 170 with improved perpendicular magnetic anisotropy, cell retention in a parallel to anti-parallel direction may be improved, and asymmetry between a switching current from the parallel direction to the anti-parallel direction and a switching current from the anti-parallel direction to the parallel direction may be improved.

Each of the plurality of polarization enhancement layers 171a and 171b may include a ferroelectric material. Each of the plurality of polarization enhancement layers 171a and 171b may include, for example, at least one element among Co, Fe, and Ni, and at least one element from boron (B), Si, Zr, Hf, beryllium, Al, carbon (C), Mo, Ta, and Cu. For example, each of the polarization enhancement layers 171a and 171b may include CoFeB.

Each of the at least one spacer layers 172a and 172b may include a non-magnetic material C1. In some embodiments, each of the at least one spacer layers 172a and 172b may further include a ferromagnetic material. The non-magnetic material C1 may induce interfacial perpendicular magnetic isotropic anisotropy on an interface between the plurality of polarization enhancement layers 171a and 171b and the plurality of spacer layers 172a and 172b. The ferroelectric material C2 may provide a magnetic path through the polarization enhancement structure 170.

In some embodiments, as shown in FIG. 5, the non-magnetic material C1 may construct grains, and the ferroelectric material C2 may be at a grain boundary of the grains. In some embodiments, the ferroelectric material C2 may form nano particles. The nano particles may have diameters from about 0.1 nm to about 10 nm. The nano particles of the ferromagnetic material C2 may be dispersed with uniformity or without uniformity in the non-magnetic material. Alternatively, the non-magnetic material C1 and the ferromagnetic material C2 may be uniformly mixed as an alloy.

The non-magnetic material C1 may include W, Mo, Ta, Pt, Ir, Al, Hf, Cr, Ru, Nb, Zr, vanadium (V), Pd, C, B, oxygen (O), nitrogen (N), or combinations thereof. When Mo is used as the non-magnetic material C1, due to a relatively high thermal stability of Mo, the thermal stability of the polarization enhancement structure 170 and the magnetic tunnel junction 100 including the same may be improved. In addition, Mo may enhance exchange coupling between the plurality of polarization enhancement layers 171a and 171b. The ferroelectric material C2 may include Co, Fe, Ni, gadolinium (Gd), samarium (Sm), neodymium (Nd), praseodymium (Pr), or combinations thereof. In some embodiments, the ferroelectric material C2 may include CoFe. In some embodiments, each of the plurality of spacer layers 172a and 172b may include MoCoFe.

Each of the plurality of spacer layers 172a and 172b may include the non-magnetic material in an amount equal to or greater than 50 at % and less than 100 at %. If each of the plurality of spacer layers 172a and 172b included the non-magnetic material C1 at less than 50 at %, then the spacer layers 172a and 172b are entirely magnetic, and therefore, from a magnetic point of view, the plurality of spacer layers 172a and 172b may not provide an interface to the plurality of polarization enhancement layers 171a and 171b. Accordingly, when each of the plurality of spacer layers 172a and 172b includes the non-magnetic material C1 less than 50 at %, the perpendicular magnetic anisotropy of the polarization enhancement structure 170 may decrease. Conversely, if each of the spacer layers 172a and 172b included the non-magnetic material C1 at 100 at % then, due to non-existence of the ferromagnetic material C2 providing the magnetic path, the exchange coupling between the plurality of polarization enhancement layers 171a and 171b decreases, and therefore, the perpendicular magnetic anisotropy of the polarization enhancement structure 170 may decrease.

Thicknesses T2 and T4 of the polarization enhancement layers 171a and 171b may be from about 5 Å to about 20 Å. If the thicknesses T2 and T4 of the polarization enhancement layers 171a and 171b are less than about 5 Å, then a polarization enhancement effect of the polarization enhancement structure 170 may be insignificant. Conversely, if the thicknesses T2 and T4 of the polarization enhancement layers 171a and 171b are greater than about 20 Å, then the perpendicular magnetic anisotropy of the polarization enhancement structure 170 may decrease.

Thicknesses T1 and T3 of the spacer layers 172a and 172b may be from about 2 Å to about 15 Å. If the thicknesses T1 and T3 of the plurality of spacer layers 172a and 172b are respectively less than about 2 Å, then the plurality of spacer layers 172a and 172b may be too thin, and therefore, from a magnetic point of view, the plurality of spacer layers 172a and 172b may not provide the interface to the plurality of polarization enhancement layers 171a and 171b. Conversely, if the thicknesses T1 and T3 of the plurality of spacer layers 172a and 172b are respectively greater than about 15 Å, then the plurality of spacer layers 172a and 172b may be too thick, and exchange coupling between the plurality of polarization enhancement layers 171a and 171b may weaken, and accordingly, the perpendicular magnetic anisotropy of the polarization enhancement structure 170 may decrease.

FIG. 5 shows that the polarization enhancement structure 170 includes two polarization enhancement layers 171a and 171b and two spacer layers (e.g., the plurality of spacer layers 172a and 172b). However, the polarization enhancement structure 170 may include another number of polarization enhancement layers and another number of spacer layers. For example, the polarization enhancement structure 170 may include two to ten polarization enhancement layers and one to ten spacer layers. If the polarization enhancement structure 170 includes eleven or more polarization enhancement layers and/or eleven or more spacer layers, then the perpendicular magnetic anisotropy of the polarization enhancement structure 170 may become too large, and therefore, it may be difficult to switch the magnetic memory device from the parallel direction to the anti-parallel direction. According to the numbers of polarization enhancement layers and spacer layers included in the polarization enhancement structure 170, a total thickness of the polarization enhancement structure 170 may be from about 12 Å to about 140 Å.

In the embodiment shown in FIG. 5, the polarization enhancement structure 170 may include a first spacer layer 172a, a first polarization enhancement layer 171a on the first spacer layer 172a, a second spacer layer 172b on the first polarization enhancement layer 171a, and a second polarization enhancement layer 171b on the second spacer layer 172b. In some embodiments, unlike in FIG. 5, the polarization enhancement structure 170 may include the first polarization enhancement layer 171a, the first spacer layer 172a on the first polarization enhancement layer 171a, the second polarization enhancement layer 171b on the first spacer layer 172a, and the second spacer layer 172b on the second polarization enhancement layer 171b.

In some embodiments, the thickness T1 of the first spacer layer 172a and the thickness T3 of the second spacer layer 172b included in the polarization enhancement structure 170 may be identical to each other. For example, the thickness T1 of the first spacer layer 172a may be identical to the thickness T3 of the second spacer layer 172b. In some embodiments, the thicknesses T2 and T4 of all the polarization enhancement layers 171a and 171b included in the polarization enhancement structure 170 may be identical to each other. For example, the thickness T2 of the first polarization enhancement layer 171a may be identical to the thickness T4 of the second polarization enhancement layer 171b.

In some embodiments, all of the first spacer layers 172a and the second spacer layers 172b included in the polarization enhancement structure 170 may have a same composition, and all the polarization enhancement layers 171a and 171b included in the polarization enhancement structure 170 may have a same composition. However, in other embodiments, the composition of the first spacer layer 172a may be different from the composition of the second spacer layer 172b, and the composition of the first polarization enhancement layer 171a may be different from the composition of the second polarization enhancement layer 171b.

The tunnel barrier layer 140 may be crystalline or amorphous. The tunnel barrier layer 140 may be non-magnetic or magnetic. The tunnel barrier layer 140 may separate the fixed layer 130 from the free layer 150. The tunnel barrier layer 140 may include $Al_2O_3$, magnesium oxide (MgO), magnesium aluminum oxide (MgAlO), $HfO_2$, $ZrO_2$, zinc peroxide ($ZnO_2$), titanium dioxide ($TiO_2$), or combinations thereof. In some embodiments, the tunnel barrier layer 140 may include a plurality of layers. For example, the tunnel barrier layer 140 may have a stack structure of Mg/MgO, MgO/Mg, MgO/MgAlO, MgAlO/MgO, Mg/MaAlO/Mg, MgO/MgAlO/MgO, MgAlO/MgO/MaAlO, or the like.

The free layer 150 may be ferromagnetic. The magnetization direction of the free layer 150 may be changed into the vertical direction (the Z direction) or the direction opposite to the vertical direction (the −Z direction). The free layer 150 may have a magnetization direction that is parallel or anti-parallel to the magnetization direction of the fixed layer 130. The free layer 150 may be crystalline. The free layer 150 may include Co, Fe, CoB, FeB, CoFe, CoFeB, CoO, FeO, CoFeO, or combinations thereof.

In some embodiments, the free layer 150 may include a first free layer 151, a second free layer 152 above the first free layer 151, and an insertion layer 153 between the first free layer 151 and the second free layer 152. Each of the first free layer 151 and the second free layer 152 may be ferromagnetic. Each of the first free layer 151 and the second free layer 152 may include Co, Fe, CoB, FeB, CoFe, CoFeB, CoO, FeO, CoFeO, or combinations thereof.

When each of the first free layer 151 and the second free layer 152 includes boron atoms, the insertion layer 153 may attract the boron atoms such that the boron atoms in the first free layer 151 and the second free layer 152 do not escape from the free layer 150. Therefore, the insertion layer 153 may include a material having an affinity to the boron atoms that is higher than an affinity of metal atoms in the first free layer 151 and the second free layer 152 to the boron atoms. The insertion layer 153 may include, for example, Mo, W, Ta, Hf, CoFeMo, Mg, or combinations thereof. A thickness of the insertion layer 153 may be from about 0 nm to about 1 nm.

The perpendicular magnetic anisotropy enhancement layer 160 may help the magnetization direction of the free layer 150 be parallel to the vertical direction Z or opposite to the vertical direction Z. The perpendicular magnetic anisotropy enhancement layer 160 may include a metal oxide, and therefore may be referred to as a metal oxide layer. Metals in the metal oxide may include, for example, Ta, Mg, Hf, Nb, Zr, Al, manganese (Mn), W, Mo, Co, Fe, Ru, or combinations thereof. The perpendicular magnetic anisotropy enhancement layer 160 may be non-magnetic or magnetic. The perpendicular magnetic anisotropy enhancement layer 160 may be crystalline or amorphous.

The capping layer 190 may be configured to protect the magnetic tunnel junction 100 in following processes after the magnetic tunnel junction 100 is manufactured. The capping layer 190 may include a metal or a metal nitride. The metal may include Ru and Ta. The metal nitride may include TiN, TaN, AlN, ZrN, NbN, MoN, or combinations thereof. In some embodiments, the capping layer 190 may include a plurality of layers. For example, the capping layer 190 may include a first capping layer 191, which includes Ru, and a second capping layer 192 on the first capping layer 191 and including Ta. The capping layer 190 may be magnetic or non-magnetic. The capping layer 190 may be crystalline or amorphous. In some embodiments, the capping layer 190 may have an HCP structure.

FIG. 6 is a cross-sectional view of a magnetic tunnel junction 100a included in the magnetic memory device 10 (see FIG. 1) according to some embodiments of the inventive concepts. Hereinafter, differences between the magnetic tunnel junction 100 shown in FIG. 5 and the magnetic tunnel junction 100a shown in FIG. 6 will be described.

Referring to FIG. 6, a thickness T2a of the first polarization enhancement layer 171a may be different from a thickness T4a of the second polarization enhancement layer 171b. For example, the thickness T2a of the first polarization enhancement layer 171a may be less than the thickness T4a of the second polarization enhancement layer 171b. In addition, a thickness T1a of the first spacer layer 172a may be different from a thickness T3 of the second spacer layer 172b. For example, the thickness T1a of the first spacer layer 172a may be less than the thickness T3a of the second spacer layer 172b.

As the second polarization enhancement layer 171b is closer to the tunnel barrier layer 140 than the first polarization enhancement layer 171a is, the second polarization enhancement layer 171b may have a greater influence on polarization of tunneling electrons. Accordingly, the polarization performance of the second polarization enhancement layer 171b may be improved by forming the second polarization enhancement layer 171b in the thickness T4a that is greater than the thickness T2a of the first polarization enhancement layer 171a. However, as the second polarization enhancement layer 171b has a greater thickness than that of the first polarization enhancement layer 171a, the perpendicular magnetic anisotropy of the second polarization enhancement layer 171b may decrease.

Figure 7:
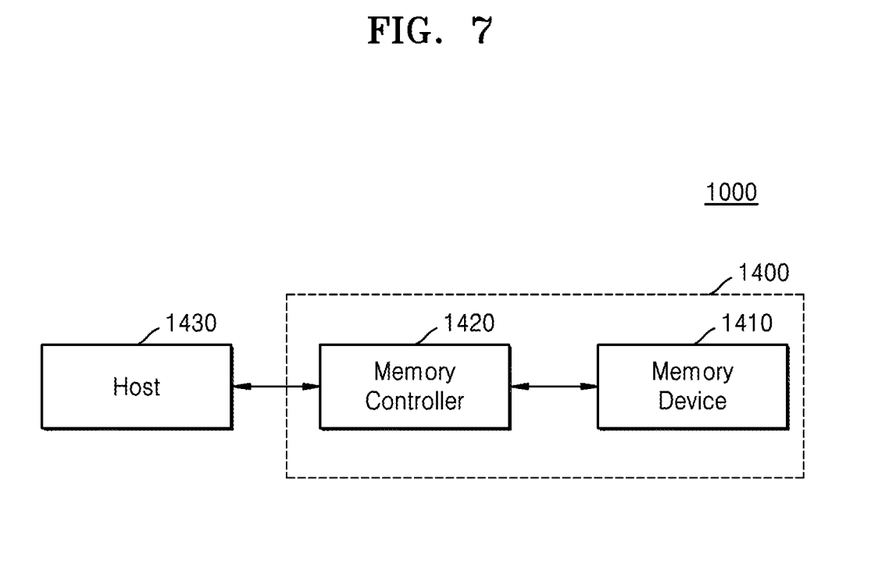
FIG. 7 is a block diagram of an electronic device according to some embodiments of the inventive concepts.

FIG. 7 is a block diagram of an electronic device 1000 according to an embodiment of the inventive concept.

Referring to FIG. 7, the electronic device 1000 may include a memory system 1400. The memory system 1400 may include a memory device 1410 and a memory controller 1420. The memory controller 1420 may control the memory device 1410 to read data stored in the memory device 1410 or write the data to the memory device 1410 in response to a read/write request from a host 1430. The memory controller 1420 may construct an address mapping table for an address provided from the host 1430 (e.g., a mobile device or a computer system) to a physical address of the memory device 1410. The memory device 1410 may include the magnetic memory device 10 described with reference to FIGS. 1 through 4, which includes the magnetic tunnel junctions 100 and 100a described with reference to FIGS. 5 and 6. In some embodiments, the electronic device may include a notebook, a computer, a tablet, a mobile phone, a wearable electronic device, or an Internet of Things (IoT) electronic product.

While the inventive concept has been particularly shown and described with reference to embodiments thereof, it will be understood that various changes in form and details may be made therein without departing from the spirit and scope of the following claims.

What is claimed is:

1. A magnetic memory device comprising a magnetic tunnel junction, wherein the magnetic tunnel junction comprises:
   a fixed layer;
   a polarization enhancement structure on the fixed layer;
   a tunnel barrier layer on the polarization enhancement structure; and
   a free layer on the tunnel barrier layer,
   wherein the polarization enhancement structure comprises a plurality of polarization enhancement layers and at least one spacer layer which separates the plurality of polarization enhancement layers from each other, with a first and second of the plurality of polarization enhancement layers both directly contacting a spacer layer of the at least one spacer layer therebetween, wherein each of the plurality of polarization enhancement layers comprises a ferromagnetic material and each of at least one spacer layers comprises a ferromagnetic material and a non-magnetic material, wherein a thickness of each of the plurality of polarization enhancement layers is from about 5 Å to about 20 Å, and wherein a thickness of the at least one spacer layer is from about 2 Å to about 15 Å.

2. The magnetic memory device of claim 1, wherein a thickness of the polarization enhancement structure is from about 12 Å to about 140 Å.

3. The magnetic memory device of claim 1, wherein a number of polarization enhancement layers is between two and ten, inclusive, and wherein a number of the at least one spacer layer is between one and ten, inclusive.

4. The magnetic memory device of claim 1, wherein each of the at least one spacer layer comprises the non-magnetic material in an amount equal to or greater than about 50 at % and less than about 100 at %.

5. The magnetic memory device of claim 1, wherein the ferromagnetic material of the polarization enhancement layers comprises at least one first element from among cobalt (Co), iron (Fe), nickel (Ni), and at least one second element from among boron (B), silicon (Si), zirconium (Zr), hafnium (Hf), beryllium (Be), aluminum (Al), carbon (C), tantalum (Ta), and copper (Cu).

6. The magnetic memory device of claim 1, wherein each of the at least one spacer layer comprises the non-magnetic material as grains and the ferromagnetic material as a grain boundary of the grains.

7. The magnetic memory device of claim 1, wherein the non-magnetic material comprises tungsten (W), molybdenum (Mo), platinum (Pt), iridium (Ir), hafnium (Hf), chromium (Cr), ruthenium (Ru), niobium (Nb), zirconium (Zr), vanadium (V), palladium (Pd), oxygen (O), nitride (N), or combinations thereof.

8. The magnetic memory device of claim 7, wherein the non-magnetic material comprises Mo.

9. The magnetic memory device of claim 1, wherein each of the at least one spacer layer comprises the ferromagnetic material as nano particles.

10. The magnetic memory device of claim 1, wherein the ferromagnetic material of the at least one spacer layer comprises cobalt (Co), iron (Fe), nickel (Ni), gadolinium (Gd), samarium (Sm), neodymium (Nd), praseodymium (Pr), or combinations thereof.

11. The magnetic memory device of claim 1, further comprising a perpendicular magnetic anisotropy enhancement layer on the free layer.

12. The magnetic memory device of claim 11, further comprising a capping layer on the perpendicular magnetic anisotropy enhancement layer.

13. The magnetic memory device of claim 1, wherein the fixed layer comprises a first fixed layer, a second fixed layer, and an anti-parallel coupling layer between the first fixed layer and the second fixed layer.

14. A magnetic memory device comprising a magnetic tunnel junction, wherein the magnetic tunnel junction comprises:

a fixed layer;

a polarization enhancement structure on the fixed layer;

a tunnel barrier layer on the polarization enhancement structure; and a free layer on the tunnel barrier layer, wherein the polarization enhancement structure comprises a plurality of cobalt-iron-boron (CoFeB) layers and at least one molybdenum-cobalt-iron (MoCoFe) layer which separates the plurality of CoFeB layers from each other.

15. The magnetic memory device of claim 14, wherein each of the at least one MoCoFe layers comprises Mo in an amount equal to or greater than about 50 at % and less than about 100 at %.

16. The magnetic memory device of claim 14, wherein a thickness of each of the plurality of CoFeB layers is from about 5 Å to about 20 Å.

17. The magnetic memory device of claim 14, wherein a thickness of each of the at least one MoCoFe layers is from about 2 Å to about 15 Å.

18. A magnetic memory device comprising a magnetic tunnel junction, wherein the magnetic tunnel junction comprises:

a fixed layer;

a polarization enhancement structure on the fixed layer;

a tunnel barrier layer on the polarization enhancement structure; and a free layer on the tunnel barrier layer, wherein the polarization enhancement structure comprises a plurality of polarization enhancement layers alternately stacked with a plurality of spacer layers, the plurality of polarization enhancement layers comprising a first polarization layer and a second polarization layer, the first polarization layer and the second polarization layer both directly contacting a first spacer layer of the plurality of spacer layers therebetween, wherein the first and second polarization layers comprise a ferromagnetic material and the first spacer layer comprises both a ferromagnetic material and a non-magnetic material, and wherein a thickness of the first of the plurality of polarization enhancement layers is different from a thickness of the second of the plurality of polarization enhancement layers.

19. The magnetic memory device of claim 18, wherein the plurality of polarization enhancement layers comprises a first polarization enhancement layer and a second polarization enhancement layer, wherein the second polarization enhancement layer is closer to the tunnel barrier layer than the first polarization enhancement layer is to the tunnel barrier layer, and wherein a thickness of the second polarization enhancement layer is greater than a thickness of the first polarization enhancement layer.

20. The magnetic memory device of claim 18, wherein a thickness of one of the plurality of spacer layers is different from a thickness of another one of the plurality of spacer layers.

* * * * *